(12) United States Patent
Takahashi et al.

(10) Patent No.: US 11,164,750 B2
(45) Date of Patent: Nov. 2, 2021

(54) SUBSTRATE PROCESSING DEVICE AND SUBSTRATE PROCESSING METHOD

(71) Applicant: SCREEN Holdings Co., Ltd., Kyoto (JP)

(72) Inventors: Tomohiro Takahashi, Kyoto (JP); Kei Takechi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/553,169

(22) Filed: Aug. 27, 2019

(65) Prior Publication Data

US 2020/0098598 A1    Mar. 26, 2020

(30) Foreign Application Priority Data

Sep. 21, 2018 (JP) .............................. JP2018-177251

(51) Int. Cl.
| | |
|---|---|
| *H01L 21/306* | (2006.01) |
| *H01L 21/67* | (2006.01) |
| *H01L 21/02* | (2006.01) |
| *H01L 21/311* | (2006.01) |
| *H01L 21/677* | (2006.01) |

(52) U.S. Cl.
CPC .... *H01L 21/30604* (2013.01); *H01L 21/0217* (2013.01); *H01L 21/02343* (2013.01); *H01L 21/31111* (2013.01); *H01L 21/6708* (2013.01); *H01L 21/67086* (2013.01); *H01L 21/67248* (2013.01); *H01L 21/67757* (2013.01)

(58) Field of Classification Search
None
See application file for complete search history.

(56) References Cited

U.S. PATENT DOCUMENTS

| | | | |
|---|---|---|---|
| 5,188,701 A | | 2/1993 | Hirano |
| 6,245,681 B1 * | | 6/2001 | Shields ............. H01L 21/31111 438/694 |
| 10,147,619 B2 | | 12/2018 | Sato et al. |
| 2017/0062231 A1 | | 3/2017 | Sato et al. |
| 2018/0233383 A1 * | | 8/2018 | Ashidate ........... H01L 21/31111 |

FOREIGN PATENT DOCUMENTS

| | | |
|---|---|---|
| JP | 2005072251 | 3/2005 |
| JP | 2013093478 | 5/2013 |
| JP | 2017118092 | 6/2017 |
| JP | 2018133551 | 8/2018 |
| KR | 940002917 | 4/1994 |

\* cited by examiner

*Primary Examiner* — Jiong-Ping Lu
(74) *Attorney, Agent, or Firm* — JCIPRNET

(57) ABSTRACT

A substrate processing method includes a first processing step of processing a substrate using phosphoric acid set to a first temperature in a processing tank, and a second processing step of processing the substrate using phosphoric acid set to a second temperature in the processing tank.

7 Claims, 15 Drawing Sheets

SUBSTRATE PROCESSING DEVICE AND SUBSTRATE PROCESSING METHOD

CROSS-REFERENCE TO RELATED APPLICATION

This application claims priority based on Japanese Patent Application No. 2018-177251, filed on Sep. 21, 2018, based on Article 119 of US Patent Law, all the contents described in this application are incorporated herein by reference.

BACKGROUND

Technical Field

A subject of this application relates to a substrate processing device and a substrate processing method.

Description of Related Art

It is known that substrates used in electronic components such as semiconductor devices and liquid crystal display devices are processed by substrate processing devices. A substrate is processed by immersing the substrate in a processing liquid inside a processing tank. For example, it is known that a silicon nitride film of a substrate is selectively etched using phosphoric acid at a high temperature.

However, silica is precipitated when a substrate is etched using phosphoric acid, and therefore a predetermined structure may not be able to be formed. Particularly, when a substrate having a micro-structure such as a three-dimensional memory device is produced, precipitation of silica sometimes becomes a problem.

Therefore, curbing precipitation of silica using a silica-precipitation inhibitor has become known. For example, precipitation of silica between layers in a silicon oxide film is curbed by mixing phosphoric acid and a silica-precipitation inhibitor with an etching liquid.

SUMMARY

According to an embodiment, there is provided a substrate processing method for processing a substrate. The substrate processing method includes a first processing step of processing the substrate using phosphoric acid set to a first temperature in a processing tank, and a second processing step of processing the substrate using phosphoric acid set to a second temperature in a processing tank.

According to another embodiment, there is provided a substrate processing device including one or more processing tanks that store phosphoric acid for processing a substrate, a substrate holding unit that holds the substrate in the phosphoric acid in the processing tank, and a temperature control unit that controls a temperature of the phosphoric acid. The temperature control unit controls the temperature of the phosphoric acid stored in the one or more processing tanks to perform processing of the substrate using phosphoric acid set to a first temperature in any processing tank of the one or more processing tanks and to perform processing of the substrate using phosphoric acid set to a second temperature in any processing tank of the one or more processing tanks.

DESCRIPTION OF THE EMBODIMENTS

In the substrate processing method according to the embodiment, the second processing step may be performed after the first processing step. The second temperature may be higher than the first temperature.

In the substrate processing method according to the embodiment, a temperature of the phosphoric acid in the processing tank used in the first processing step may be changed in the second processing step.

In the substrate processing method according to the embodiment, the first processing step may include a step of immersing the substrate in a first processing tank storing the phosphoric acid set to the first temperature, and the second processing step may include a step of immersing the substrate in a second processing tank storing the phosphoric acid set to the second temperature.

In the substrate processing method according to the embodiment, the first processing step and the second processing step may be alternately repeated.

The substrate processing method according to the embodiment may further include a third processing step of processing the substrate using phosphoric acid set to a third temperature in a processing tank.

In the substrate processing method according to the embodiment, the third processing step may be performed after the first processing step and the second processing step. The third temperature may be higher than the first temperature and the second temperature.

The substrate processing method according to the embodiment may further include a heating step of heating a substrate support unit which supports the substrate.

In the substrate processing method according to the embodiment, the substrate support unit may be intermittently heated in the heating step.

Hereinafter, a substrate processing device and a substrate processing method of the present embodiment will be described with reference to the drawings. In the diagrams, the same reference signs are applied to parts which are the same as or correspond to each other, and description thereof will not be repeated. In the specification of this application, in order to facilitate the understanding, an X-axis, a Y-axis, and a Z-axis which are orthogonal to one another are indicated sometimes. Typically, the X-axis and the Y-axis are parallel to the horizontal direction, and the Z-axis is parallel to the vertical direction.

Figure 1:
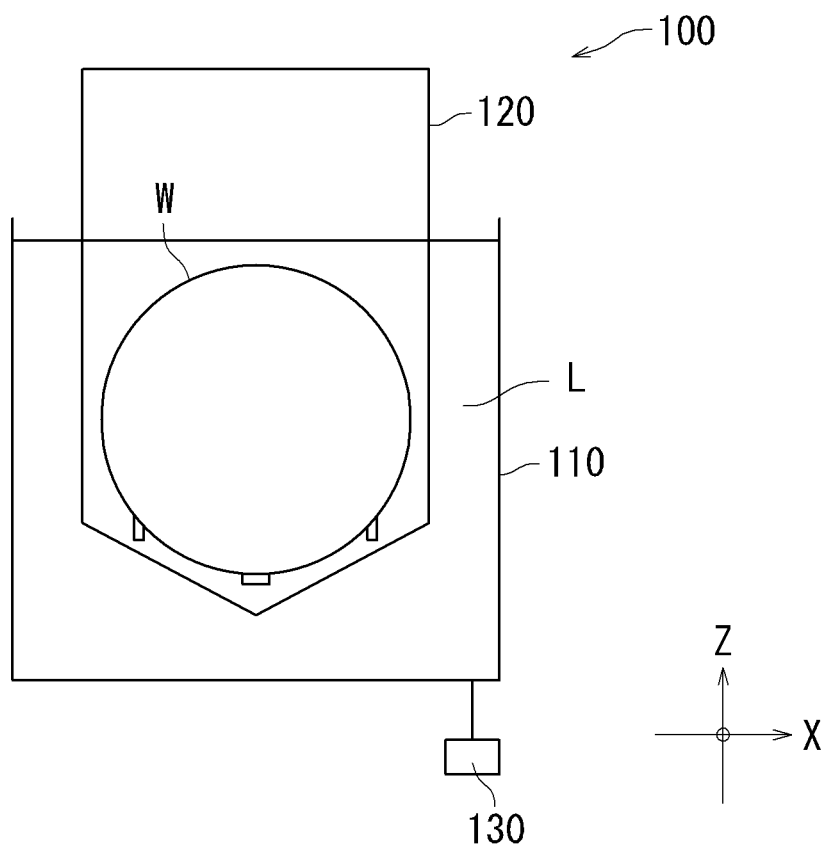
FIG. 1 is a schematic view of a substrate processing device of the present embodiment.

With reference to FIG. 1, a substrate processing device 100 of the present embodiment will be described. FIG. 1 is a schematic view of the substrate processing device 100 of the present embodiment. The substrate processing device 100 performs processing of a substrate W. The substrate processing device 100 performs processing of the substrate W such that the substrate W is subjected to at least one of etching, surface treatment, impartment of properties, formation of a processed film, removing of at least a part of a film, and washing.

The substrate W has a thin plate shape. Typically, the substrate W has a substantially circular thin plate shape. Examples of the substrate W include a semiconductor wafer, a substrate for a liquid crystal display device, a substrate for a plasma display, a substrate for a field emission display (FED), a substrate for an optical disc, a substrate for a magnetic disk, a substrate for a magneto-optical disc, a substrate for a photomask, a ceramic substrate, and a substrate for a solar battery.

The substrate processing device 100 performs processing of the substrate W using phosphoric acid L. Here, the substrate processing device 100 is a batch-type processing device which collectively performs processing of a plurality of substrates W. The substrate W is subjected to at least one of etching, surface treatment, impartment of properties, formation of a processed film, removing of at least a part of a film, and washing using the phosphoric acid L.

The substrate processing device 100 includes a processing tank 110, a substrate holding unit 120, and a temperature control unit 130. The processing tank 110 stores the phosphoric acid L for performing processing of the substrate W.

The substrate holding unit 120 holds the substrate W. A normal direction of a main surface of the substrate W held by the substrate holding unit 120 is parallel to a Y-direction. The substrate holding unit 120 moves the substrate W while holding the substrate W. For example, the substrate holding unit 120 moves vertically upward or vertically downward while holding the substrate W. Alternatively, the substrate holding unit 120 may move in the horizontal direction while holding the substrate W.

Typically, the substrate holding unit 120 collectively holds a plurality of substrates W. Here, a plurality of substrates W are arranged in a row in the Y-direction. The substrate holding unit 120 may hold only one substrate W.

The temperature control unit 130 controls the temperature of the phosphoric acid L inside the processing tank 110. Accordingly, the substrate W is processed using the phosphoric acid L at a predetermined temperature.

The temperature control unit 130 controls the temperature of the phosphoric acid L inside the processing tank 110. The temperature control unit 130 may directly control the temperature of the phosphoric acid L inside the processing tank 110. Alternatively, the temperature control unit 130 may control the temperature of the phosphoric acid L inside the processing tank 110 by controlling the temperature and the flow rate of phosphoric acid supplied to the processing tank 110. For example, the temperature control unit 130 may control the temperature of the phosphoric acid L inside the processing tank 110 by controlling a nozzle of a phosphoric acid supply member disposed outside the processing tank 110, an adjustment valve, a heater, or the like.

For example, the temperature control unit 130 is constituted using a microcomputer. The temperature control unit 130 has a computation unit such as a CPU, a storage unit such as a fixed memory device or a hard disk drive, and an input/output unit. A program executed by the computation unit is stored in the storage unit. The temperature control unit 130 controls an operation of a heater and/or a cooler in accordance with a program set in advance.

In the substrate processing device 100 of the present embodiment, the temperature control unit 130 performs processing of the substrate W using phosphoric acid set to a first temperature in the processing tank 110. In addition, the temperature control unit 130 performs processing of the substrate W using phosphoric acid set to a second temperature different from the first temperature in the processing tank 110. Accordingly, the substrate processing time can be shortened and disadvantages in substrate processing can be curbed.

Next, with reference to FIGS. 2A to 2D, the substrate processing method of the present embodiment will be described. FIGS. 2A to 2D are schematic views for describing the substrate processing method of the present embodiment.

Figure 2A:
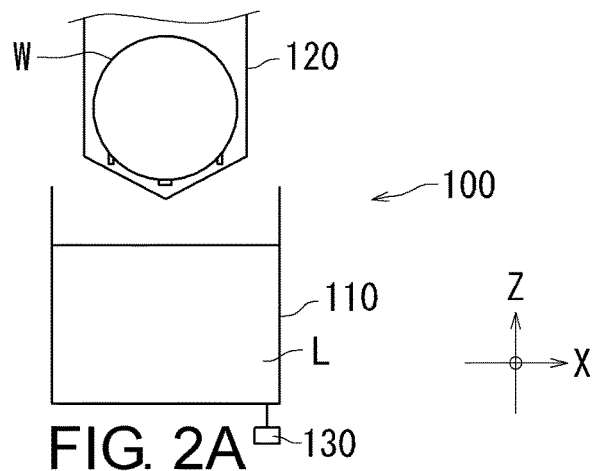
FIGS. 2A to 2D are schematic views for describing a substrate processing method of the present embodiment.

As illustrated in FIG. 2A, the phosphoric acid L is stored in the processing tank 110. Here, the substrate holding unit 120 holds the substrate W above the processing tank 110. For example, the temperature control unit 130 may set the temperature of the phosphoric acid L inside the processing tank 110 to the first temperature before the substrate W is immersed in the processing tank 110.

Figure 2B:
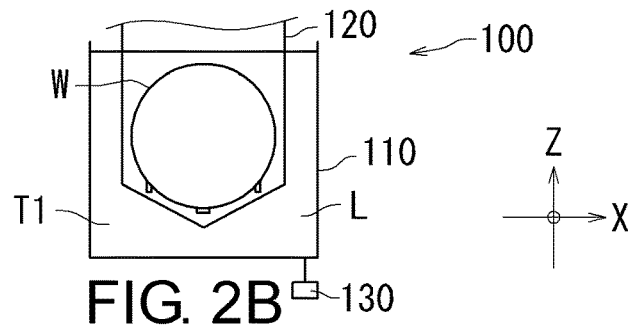

As illustrated in FIG. 2B, the substrate holding unit 120 moves downward such that the substrate W is immersed in the phosphoric acid L inside the processing tank 110 while holding the substrate W. The phosphoric acid L in the processing tank 110 is set to a first temperature T1, and the substrate W is processed using the phosphoric acid L at the first temperature T1. The temperature of the phosphoric acid L may be set to the first temperature T1 before the substrate W is immersed in the processing tank 110. Alternatively, the temperature of the phosphoric acid L may be adjusted to the first temperature T1 after the substrate W is immersed in the processing tank 110. For example, the first temperature T1 is within a range of 120° C. to 160° C.

Figure 2C:
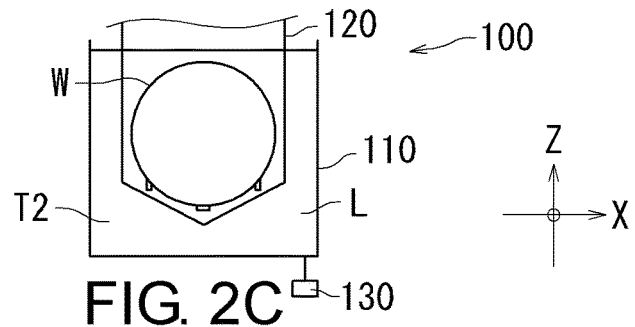

As illustrated in FIG. 2C, when the substrate W is subjected to phosphoric acid processing, the temperature of the phosphoric acid L in the processing tank 110 is set to a second temperature T2, and the substrate W is processed using the phosphoric acid L at the second temperature T2. The second temperature T2 is a temperature different from the first temperature T1. The second temperature T2 may be a temperature higher or lower than the first temperature T1. In this case, the second temperature T2 may be within a range of 120° C. to 160° C.

However, it is preferable that the second temperature T2 be a temperature higher than the first temperature T1. For example, it is preferable that the second temperature T2 be a temperature higher than the first temperature T1 by a temperature within a range of 3° C. to 20° C. When the second temperature T2 is higher than the first temperature T1, the speed of processing using phosphoric acid can be improved.

Figure 2D:
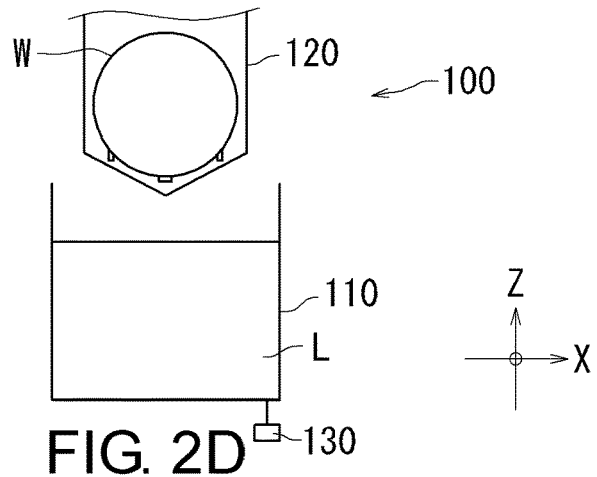

As illustrated in FIG. 2D, the substrate holding unit 120 moves the substrate W upward while holding the substrate W and raises the substrate W from the phosphoric acid L inside the processing tank 110. When the substrate W is raised from the processing tank 110, substrate processing ends.

The substrate processing device 100 of the present embodiment is favorably used for processing of the substrate W having a micro-structure. For example, the substrate W is used for a memory having a NAND structure. As an example, the substrate W is favorably used for a NAND memory having a three-dimensional structure.

Figure 3A:
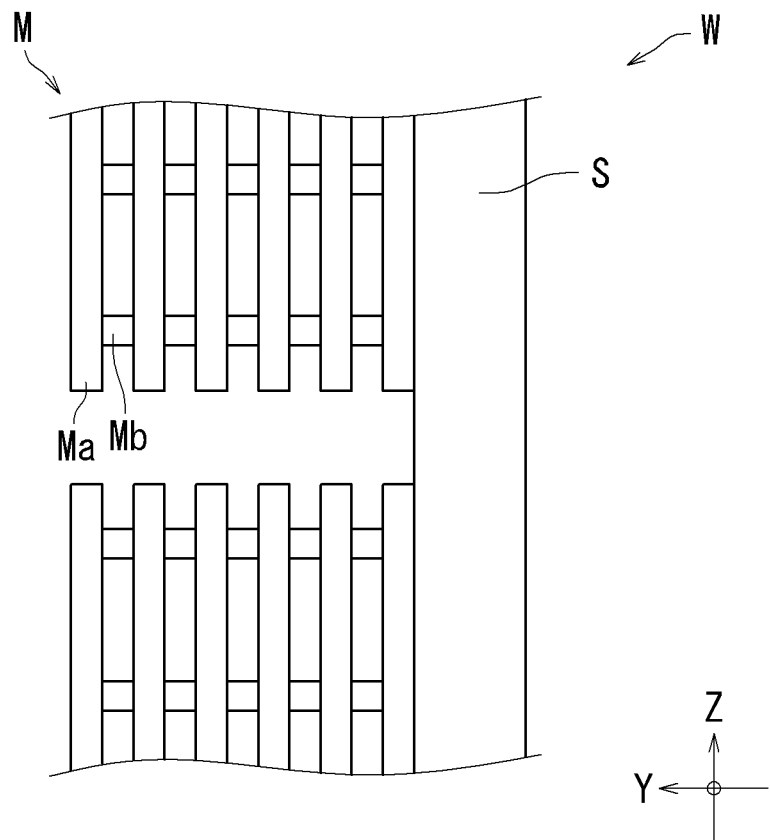
FIGS. 3A and 3B are schematic views of a substrate processed by the substrate processing method of the present embodiment.
Figure 3B:
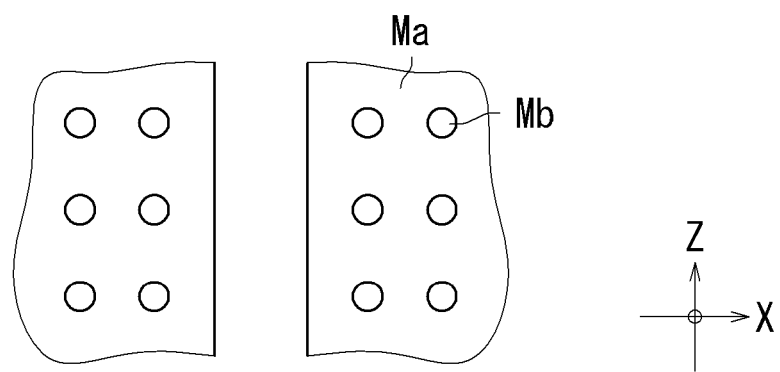

Next, with reference to FIGS. 3A and 3B, the substrate W processed by the substrate processing method of the present embodiment will be described. FIGS. 3A and 3B are schematic views of the substrate W processed by the substrate processing method of the present embodiment. The substrate W is favorably used for a NAND memory having a three-dimensional structure.

The substrate W can be favorably produced by the substrate processing device 100 of the present embodiment. In FIGS. 3A and 3B, it is noted that the substrate W is disposed in a direction immediately after being processed in the phosphoric acid L in the processing tank 110 of the substrate processing device 100.

As illustrated in FIG. 3A, the substrate W is disposed such that the main surface of the substrate W expands in an XZ-plane. The substrate W has a base material S and a layered structure M. The base material S has a thin film shape expanding in the XZ-plane. The layered structure M is formed on an upper surface of the base material S. The layered structure M is formed to extend in in the Y-direction from the upper surface of the base material S. The layered structure M is formed of a material which is not etched using phosphoric acid. For example, the layered structure M is formed of a silicon oxide film and/or a metal.

The layered structure M has a plurality of flat layers Ma and pillars Mb positioned between the flat layers Ma. Each of the plurality of flat layers Ma extends in parallel to the upper surface of the base material S. A plurality of pillars Mb are provided between two adjacent flat layers Ma. Two adjacent flat layers Ma are supported by the pillars Mb.

For example, the thickness (length in the Y-direction) of the flat layer Ma is within a range of 1 nm to 50 nm. In addition, for example, the thickness (length in the Y-direction) of the pillar Mb is within a range of 1 nm to 50 nm, and the width (length in a Z-direction) of the pillar Mb is within a range of 1 nm to 50 nm.

FIG. 3B is a schematic view of a cross section obtained by cutting middle parts of the pillars Mb of the layered structure M in parallel to the XZ-plane. The flat layer Ma expands in the XZ-plane. A plurality of pillars Mb are disposed on the flat layer Ma, and the pillars Mb extend in the Y-direction with respect to the flat layer Ma. Here, the pillars Mb are arranged in a matrix shape in an X-direction and the Z-direction.

Figure 4A:
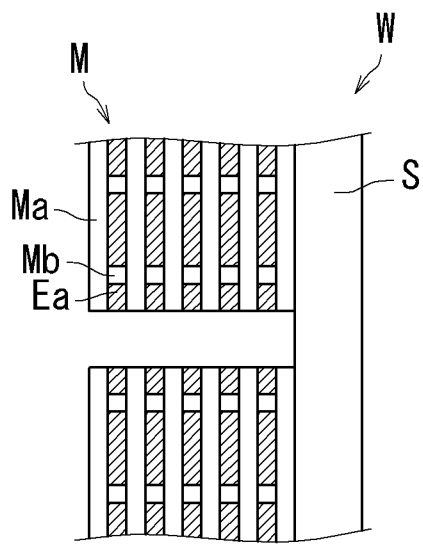
FIGS. 4A to 4D are schematic views illustrating a change in a substrate processed by the substrate processing method of the present embodiment.
Figure 4B:
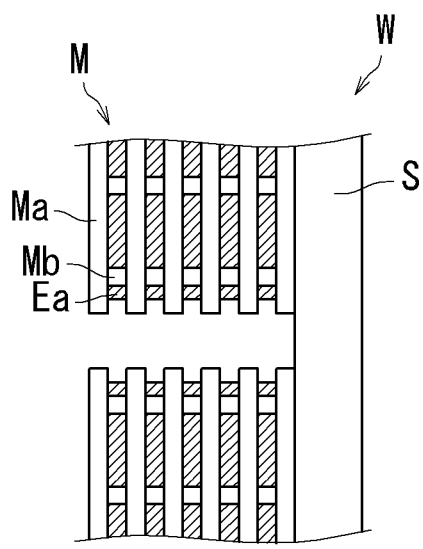
Figure 4C:
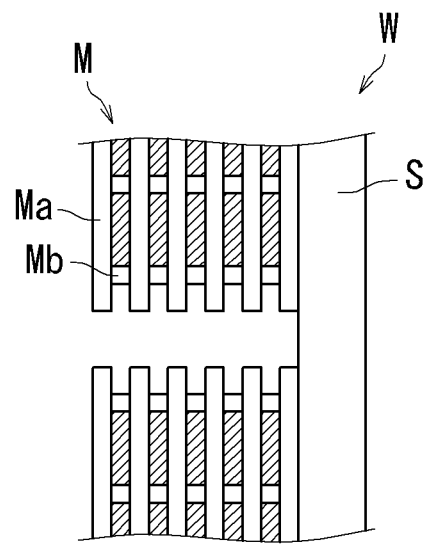

Next, with reference to FIGS. 4A to 4D, a change in the substrate W processed by the substrate processing method of the present embodiment will be described. FIGS. 4A to 4C are schematic views illustrating a change in the substrate W processed by the substrate processing method of the present embodiment.

As illustrated in FIG. 4A, the substrate W is disposed to expand in the XZ-plane. The substrate W has the base material S and the layered structure M. The base material S is a thin film expanding in the XZ-plane. The layered structure M is disposed on the upper surface of the base material S. The layered structure M extends in the Y-direction from the upper surface of the base material S.

Depressions are formed in the layered structure M. Here, the depressions of the layered structure M reach the base material S, and a part of the base material S is exposed.

The layered structure M has a plurality of flat layers Ma and a plurality of etching layers Ea. The flat layers Ma and the etching layers Ea are alternately layered. Each of the plurality of flat layers Ma and the plurality of etching layers Ea extends in parallel to the upper surface of the base material S.

The flat layer Ma is formed of a material which is not etched using phosphoric acid. For example, the flat layer Ma is formed of a silicon oxide film.

The pillar Mb is embedded in the etching layer Ea. The etching layer Ea is formed of a material which is etched using phosphoric acid. For example, the etching layer Ea is formed of a silicon nitride film. The pillar Mb is formed of a material which is not etched using phosphoric acid. For example, the pillar Mb is formed of a silicon oxide film or a metal film.

As illustrated in FIG. 4B, when phosphoric acid processing with respect to the substrate W is started, phosphoric acid infiltrates into the depressions of the substrate W, and the etching layers Ea are etched. The phosphoric acid comes into contact with the flat layers Ma and the etching layers Ea in an interface of the depressions of the layered structure M. The flat layers Ma do not melt due to the phosphoric acid, but the etching layers Ea melt due to the phosphoric acid. Therefore, the phosphoric acid causes the etching layers Ea to gradually melt, so that the etching layers Ea are etched. The phosphoric acid causes the etching layers Ea to melt in the depressions of the layered structure M. Thereafter, the phosphoric acid which has caused the etching layers Ea to melt flows out to the outside from the depressions of the substrate W.

In FIG. 4B, the area of the interface between the phosphoric acid and the etching layers Ea is relatively wide. In this case, it is preferable that the phosphoric acid be set to a relatively low temperature as the first temperature.

As illustrated in FIG. 4C, when phosphoric acid processing with respect to the substrate W is continuously performed, etching of the etching layers Ea proceeds due to the phosphoric acid. The phosphoric acid causes the etching layers Ea to gradually melt, so that the etching layers Ea are etched and the pillars Mb are exposed.

In FIG. 4C, the etching layers Ea are etched until they reach the pillars Mb. Unlike the etching layers Ea, the pillars Mb do not melt due to the phosphoric acid. Therefore, compared to a state before reaching the pillars Mb, the area of the interface between the phosphoric acid and the etching layers Ea becomes narrow. In this case, it is preferable that the phosphoric acid be set to a temperature higher than the first temperature as the second temperature.

Figure 4D:
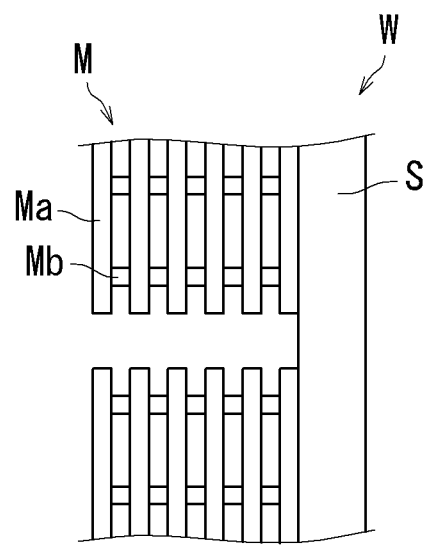

As illustrated in FIG. 4D, when phosphoric acid processing with respect to the substrate W continues, all of the etching layers Ea of the substrate W melt due to the phosphoric acid and are removed. Phosphoric acid processing with respect to the substrate W ends. At this time, the layered structure M having the flat layers Ma and the pillars Mb is formed in the substrate W. In this manner, the substrate W having the layered structure M can be produced through phosphoric acid processing.

In as described above with reference to FIGS. 1 and 2A to 2D, the substrate processing method of the present embodiment, the temperature control unit 130 adjusts the temperature of the phosphoric acid. At this time, the temperature control unit 130 can adjust the temperature of the phosphoric acid in accordance with the area of the interface between the phosphoric acid and the etching layers Ea.

For example, in the substrate processing method of the present embodiment, when the area of the interface between the phosphoric acid and the etching layers Ea is relatively wide, the substrate W is processed using phosphoric acid set to a relatively low temperature. In this case, an excessively saturated concentration of the phosphoric acid for processing the substrate W can be curbed, and precipitation from the phosphoric acid can be curbed. On the contrary, when the area of the interface between the phosphoric acid and the etching layers Ea is relatively narrow, the substrate W is processed using phosphoric acid set to a relatively high temperature. In this case as well, since the phosphoric acid for processing the substrate W does not exceed the saturated concentration, the speed of substrate processing can be improved. Accordingly, the substrate processing time can be shortened and disadvantages in substrate processing can be curbed.

On the other hand, when phosphoric acid processing is performed at a relatively low temperature without changing the temperature of the phosphoric acid, no disadvantage occurs in substrate processing. However, since the etching rate of phosphoric acid with respect to a silicon nitride film is relatively low, the substrate processing time increases. Therefore, a throughput of substrate processing is degraded.

In addition, when phosphoric acid processing is performed at a relatively high temperature without changing the temperature of the phosphoric acid, the substrate processing time can be shortened. However, since the etching rate of phosphoric acid with respect to a silicon nitride film is relatively high, if the depressions have a small diameter when a relatively large number of silicon nitride films melt in phosphoric acid, a relatively large number of silicon nitride films melt in the phosphoric acid. Therefore, the concentration of the silicon nitride film which has melted with respect to the phosphoric acid increases. In this case, when the concentration exceeds the saturated concentration of the phosphoric acid, a melted substance which has melted may be precipitated from the phosphoric acid.

Figure 5:
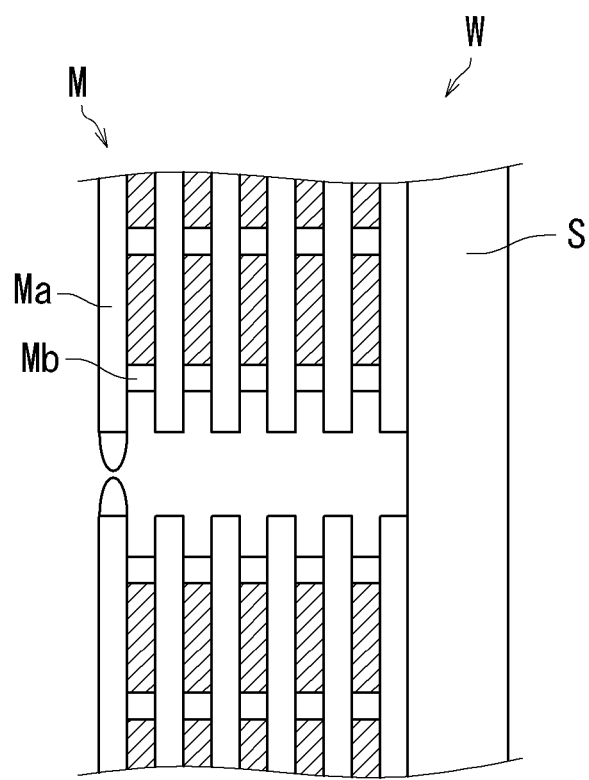
FIG. 5 is a schematic view of a substrate processed by a substrate processing method of a comparative example.

FIG. 5 is a schematic view of a substrate in which a melted substance is precipitated from phosphoric acid. As illustrated in FIG. 5, a melted substance which has melted once in phosphoric acid may be precipitated in the layered structure. For example, after a silicon nitride film near the base material S has melted in phosphoric acid, the concentration of a silicon nitride film, which has melted in the phosphoric acid while the phosphoric acid passes through the depressions of the layered structure from the front surface of the base material S, increases. If the concentration exceeds the saturated concentration, a melted substance may be precipitated in the layered structure from the phosphoric acid.

In contrast, in the substrate processing device 100 of the present embodiment, when the area of a silicon nitride film which comes into contact with phosphoric acid is relatively wide, excessive melting of the silicon nitride film in the phosphoric acid can be curbed and precipitation of a melted substance can be curbed by etching the silicon nitride film at a relatively low temperature. On the other hand, when the area of a silicon nitride film which comes into contact with phosphoric acid is relatively narrow, the silicon nitride film can be promptly etched using the phosphoric acid and the substrate processing time can be shortened by etching the silicon nitride film at a relatively high temperature.

The temperature profile of the temperature control unit 130 may be determined in advance based on the structure of the substrate W and the etching rate of phosphoric acid. For example, when an etching target is a silicon nitride film, the etching rate of the silicon nitride film using phosphoric acid when the temperature of the phosphoric acid is 160° C. is 5 nm/min. Similarly, when the temperature of the phosphoric acid is 150° C., the etching rate of the silicon nitride film using phosphoric acid is 3.3 nm/min. When the temperature of the phosphoric acid is 140° C., the etching rate of the silicon nitride film using phosphoric acid is 2.5 nm/min.

For example, as illustrated in FIGS. 4A to 4D, when a silicon nitride film in which the pillars Mb of the layered structure M of the substrate W are not exposed is etched by the length of 10 nm, the temperature of the phosphoric acid is set to 150° C. as the first temperature, and the processing time is set to three minutes. Thereafter, when a silicon nitride film in which the pillars Mb of the layered structure M of the substrate W are exposed is etched by the length of 10 nm, the temperature of the phosphoric acid is set to 160° C. as the second temperature, and the processing time is set to two minutes. In this manner, the setting temperature and the processing time of phosphoric acid can be determined in accordance with the exposed area of a silicon nitride film.

In the foregoing description referring to FIGS. 2A to 2D, in the substrate processing device 100, the temperature of the phosphoric acid L inside the processing tank 110 is changed to the second temperature after the first temperature. However, the present embodiment is not limited thereto. The temperature of the phosphoric acid L inside the processing tank 110 may be set such that the first temperature and the second temperature are alternately repeated. For example, when a silicon nitride film of the substrate W is etched through phosphoric acid processing of the substrate W, in a case where the exposed area of the silicon nitride film in the substrate W is alternately changed such that the area becomes wide, narrow, wide, and narrow, the temperature of the phosphoric acid L inside the processing tank 110 may be set such that the first temperature and the second temperature are alternately repeated.

In addition, in the substrate processing device 100 illustrated in FIG. 2A to 2D, the phosphoric acid L inside the processing tank 110 is set to the first temperature T1 and the second temperature T2. However, the present embodiment is not limited thereto. The phosphoric acid L inside the processing tank 110 may be set to the first temperature, the second temperature, and a third temperature.

Next, with reference to FIGS. 6A to 6E, the substrate processing method of the present embodiment will be described. FIGS. 6A to 6E are schematic views for describing the substrate processing method of the present embodiment. The substrate processing method illustrated in FIGS. 6A to 6E is similar to the substrate processing method described above with reference to FIGS. 2A to 2D except that the temperature of the phosphoric acid L inside the processing tank 110 is set to the second temperature T2 and then the temperature of the phosphoric acid L is set to a third temperature T3. Therefore, duplicate description will be omitted to avoid redundancy.

Figure 6A:
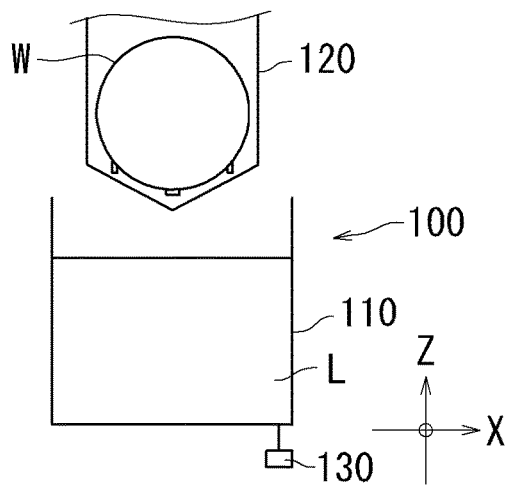
FIGS. 6A to 6E are schematic views for describing the substrate processing method of the present embodiment.

As illustrated in FIG. 6A, the phosphoric acid L is stored in the processing tank 110. The substrate holding unit 120 holds the substrate W above the processing tank 110. For example, the temperature control unit 130 may set the temperature of the phosphoric acid L inside the processing tank 110 to the first temperature before the substrate W is immersed in the processing tank 110.

Figure 6B:
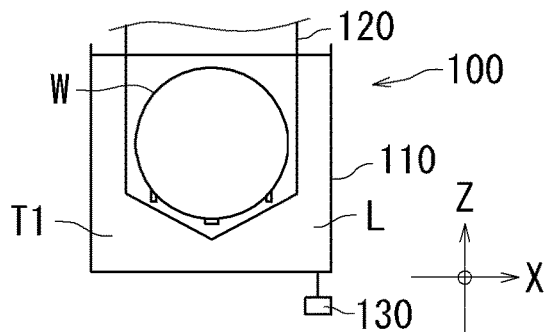

As illustrated in FIG. 6B, the substrate holding unit 120 moves downward while holding the substrate W such that the substrate W is immersed in the phosphoric acid L inside the processing tank 110. The phosphoric acid L in the processing tank 110 is set to the first temperature T1, and the substrate W is processed using the phosphoric acid L at the first temperature T1. For example, the first temperature T1 is within a range of 120° C. to 160° C.

Figure 6C:
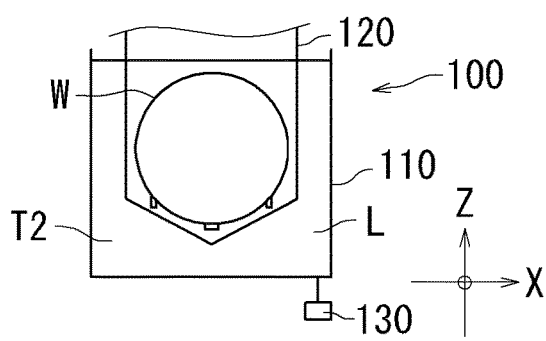

As illustrated in FIG. 6C, when the substrate W is subjected to phosphoric acid processing, the temperature of the phosphoric acid L in the processing tank 110 is set to the second temperature T2, and the substrate W is processed using the phosphoric acid L at the second temperature T2. The second temperature T2 may be a temperature higher or lower than the first temperature T1. In this case, the second temperature T2 may be within a range of 120° C. to 160° C.

Figure 6D:
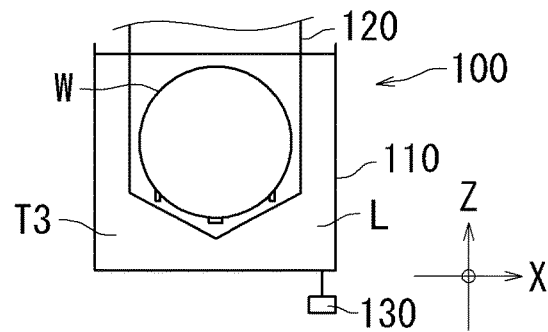

As illustrated in FIG. 6D, when the substrate W is subjected to phosphoric acid processing, the temperature of the phosphoric acid L in the processing tank 110 is set to the third temperature T3, and the substrate W is processed using the phosphoric acid L at the third temperature T3. The third temperature T3 may be a temperature higher or lower than the second temperature T2. In this case, the third temperature T3 may be within a range of 120° C. to 160° C.

However, it is preferable that the third temperature T3 be a temperature higher than the second temperature T2. For example, it is preferable that the third temperature T3 be a temperature higher than the second temperature T2 by a range of 3° C. to 15° C. When the third temperature T3 is higher than the second temperature T2, the speed of processing using phosphoric acid can be improved.

Figure 6E:
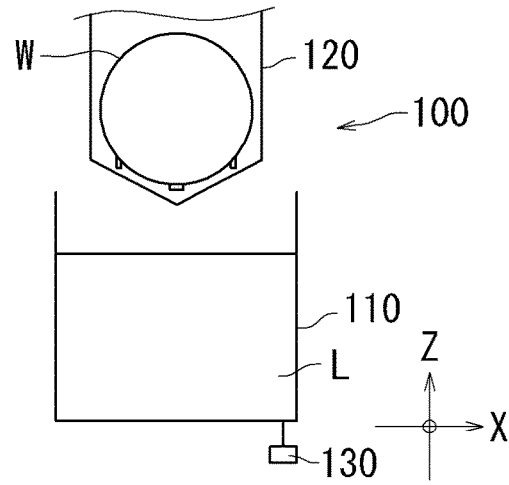

As illustrated in FIG. 6E, the substrate holding unit 120 moves the substrate W upward while holding the substrate W and raises the substrate W from the phosphoric acid L in the processing tank 110. When the substrate W is raised from the processing tank 110, substrate processing ends.

In the foregoing description referring to FIGS. 2A to 2D and 6A to 6E, the substrate W is processed by changing the temperature of the phosphoric acid inside the same processing tank 110. However, the present embodiment is not limited thereto. The substrate W may be processed inside a processing tank having a different temperature of the phosphoric acid.

Next, with reference to FIGS. 7A to 7E, the substrate processing method of the present embodiment will be described. FIGS. 7A to 7E are schematic views for describing the substrate processing method of the present embodiment.

Figure 7A:
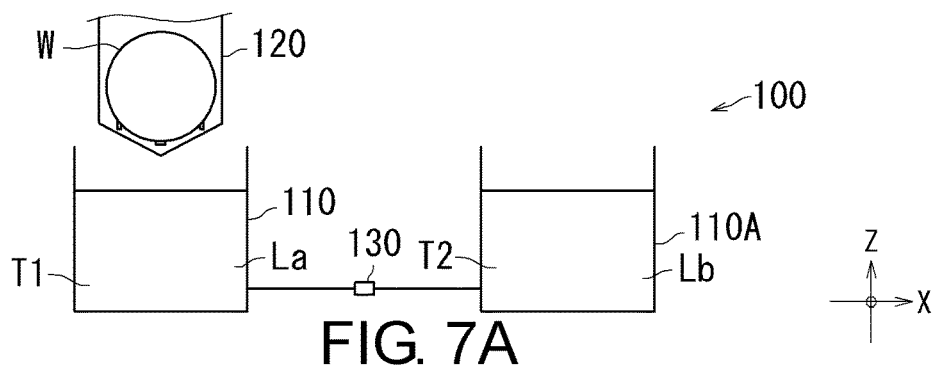
FIGS. 7A to 7E are schematic views for describing the substrate processing method of the present embodiment.

As illustrated in FIG. 7A, the substrate processing device 100 includes the processing tank 110 and a processing tank 110A. Phosphoric acid La is stored in the processing tank 110, and phosphoric acid Lb is stored in the processing tank 110A. The temperature control unit 130 controls the temperature of the phosphoric acid La in the processing tank 110 and the temperature of the phosphoric acid Lb in the processing tank 110A. Here, the temperature control unit 130 sets the temperature of the phosphoric acid La in the processing tank 110 to the first temperature T1 and sets the temperature of the phosphoric acid Lb in the processing tank 110A to the second temperature T2.

The substrate holding unit 120 holds the substrate W. Here, the substrate holding unit 120 is positioned above the processing tank 110.

Figure 7B:
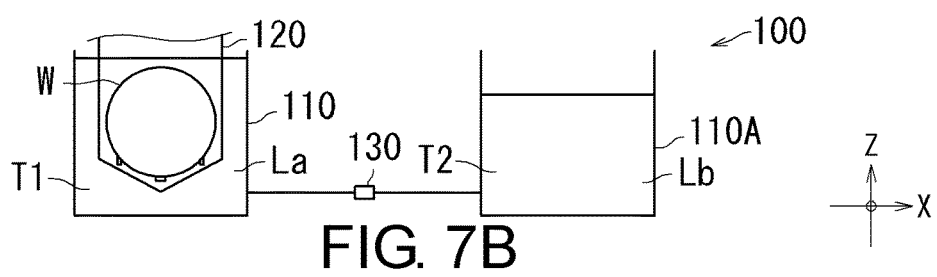

As illustrated in FIG. 7B, the substrate holding unit 120 moves downward while holding the substrate W such that the substrate W is immersed in the phosphoric acid La inside the processing tank 110. At this time, the phosphoric acid La in the processing tank 110 is set to the first temperature, and the substrate W is processed using the phosphoric acid La at the first temperature.

Figure 7C:
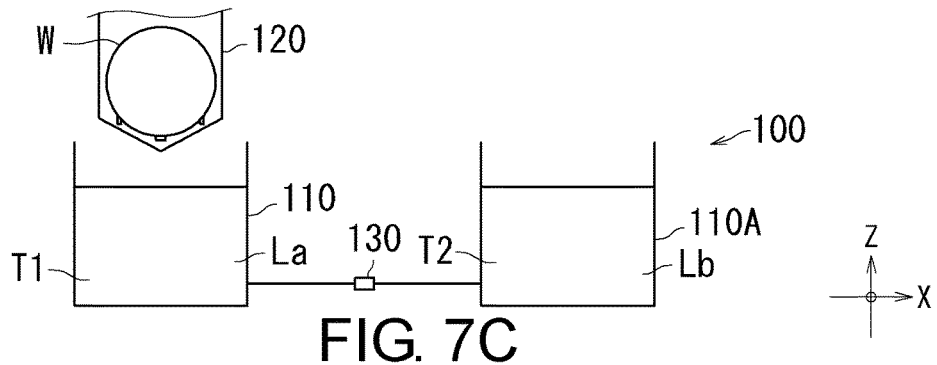

As illustrated in FIG. 7C, the substrate holding unit 120 moves upward while holding the substrate W and raises the substrate W from the phosphoric acid La in the processing tank 110. Thereafter, the substrate holding unit 120 moves to a place above the processing tank 110A.

Figure 7D:
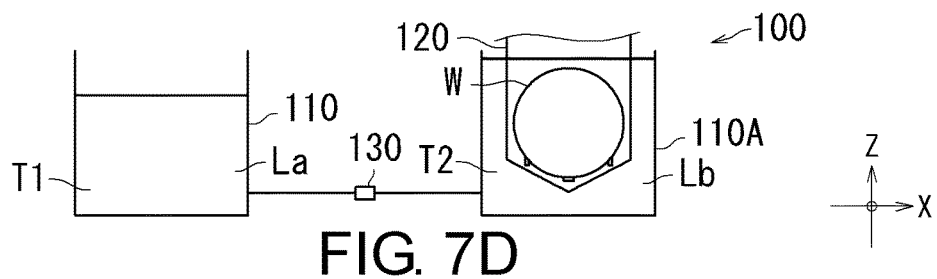

As illustrated in FIG. 7D, the substrate holding unit 120 moves downward while holding the substrate W such that the substrate W is immersed in the phosphoric acid Lb inside the processing tank 110A. At this time, the phosphoric acid Lb in the processing tank 110A is set to the second temperature T2, and the substrate W is processed using the phosphoric acid Lb at the second temperature T2.

Figure 7E:
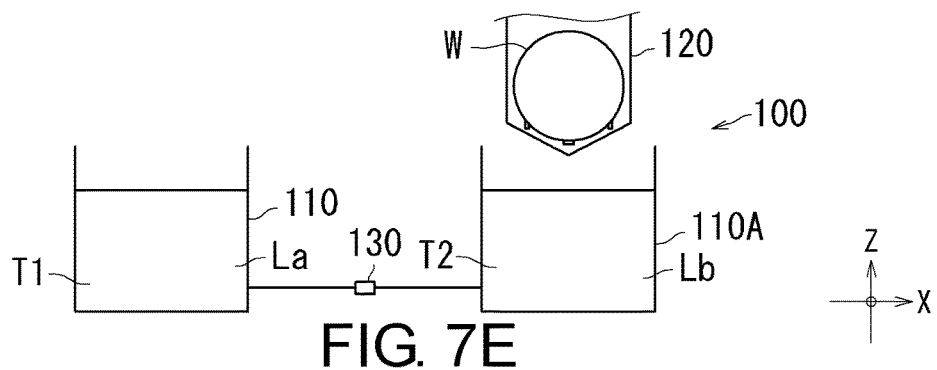

As illustrated in FIG. 7E, the substrate holding unit 120 moves upward while holding the substrate W and raises the substrate W from the phosphoric acid Lb in the processing tank 110A. When the substrate W is raised from the phosphoric acid Lb in the processing tank 110, substrate processing ends.

In FIGS. 7B to 7D, the substrate W is moved from the processing tank 110 to the processing tank 110A. At this time, it is preferable not to perform processing for the substrate W during phosphoric acid processing other than movement. For example, it is preferable not to perform processing such as rinsing and washing for the substrate W during phosphoric acid processing.

In the foregoing description referring to FIGS. 7A to 7E, the substrate processing device 100 includes two processing tanks 110 and 110A set to different temperatures. However, the present embodiment is not limited thereto. The substrate processing device 100 may include three or more processing tanks set to different temperatures.

Figure 8:
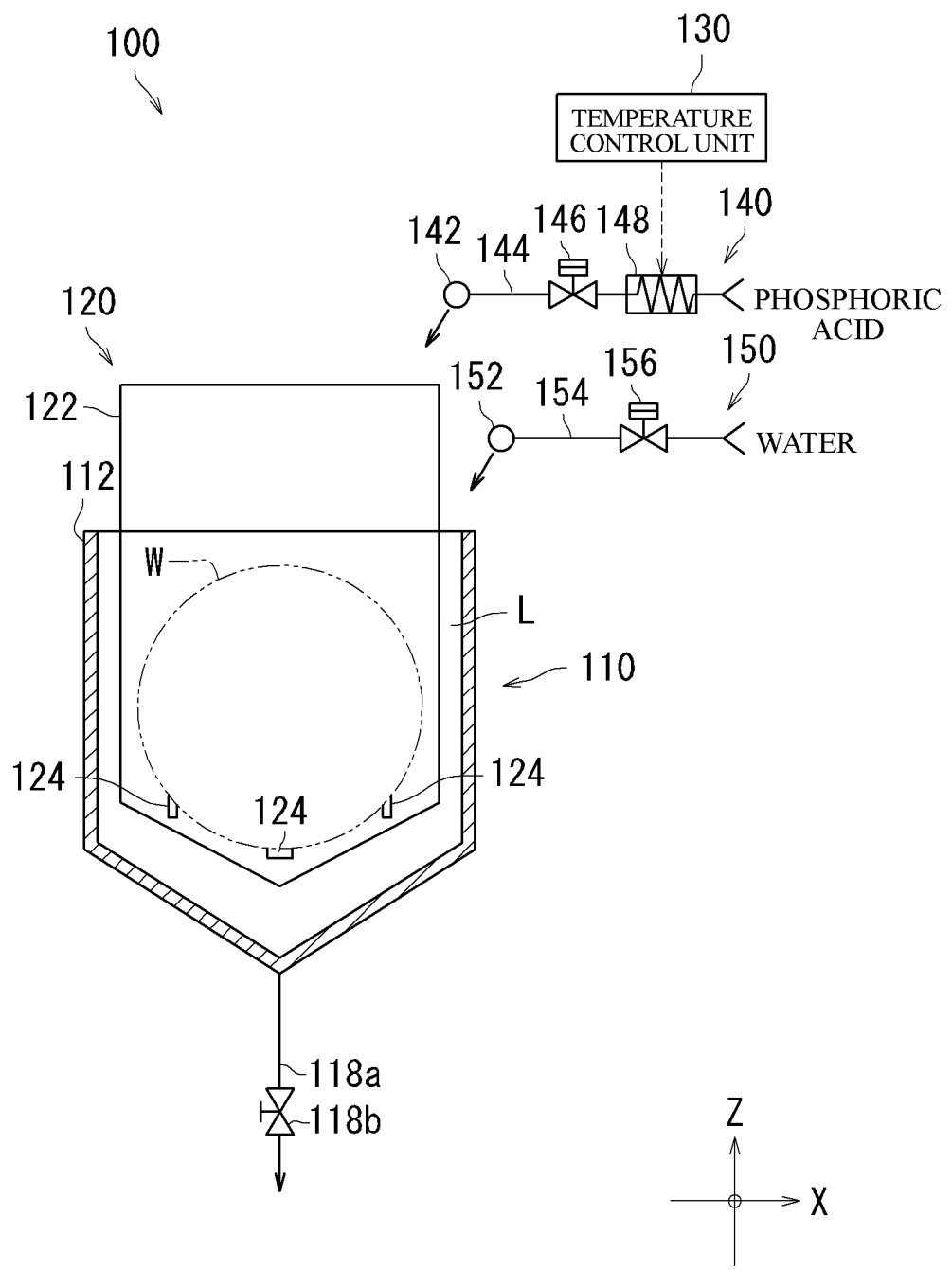
FIG. 8 is a schematic view of the substrate processing device of the present embodiment.

Next, with reference to FIG. 8, the substrate processing device 100 of the present embodiment will be described. FIG. 8 is a schematic view of the substrate processing device 100 of the present embodiment. In the substrate processing device 100 illustrated in FIG. 8, the substrate W is processed using phosphoric acid at different temperatures by changing the temperature of the phosphoric acid inside the processing tank 110. The substrate processing device 100 of the present embodiment collectively performs processing of a plurality of substrates W. For example, the substrate processing device 100 collectively performs etching with respect to a plurality of substrates W.

The substrate processing device 100 of the present embodiment includes the processing tank 110, the substrate holding unit 120, and the temperature control unit 130. The processing tank 110 stores the phosphoric acid L. Examples of the phosphoric acid L include an etching liquid. The substrate holding unit 120 holds the substrate W. The substrate holding unit 120 includes a lifter. A plurality of substrates W can be collectively immersed in the phosphoric acid L stored in the processing tank 110 by the substrate holding unit 120.

The substrate processing device 100 further includes a phosphoric acid supply unit 140 and a water supply unit 150. The phosphoric acid supply unit 140 supplies phosphoric acid to the processing tank 110. The water supply unit 150 supplies water to the processing tank 110.

A drainage piping 118a is connected to a bottom wall of the processing tank 110. A valve 118b is disposed in the drainage piping 118a. When the valve 118b is opened, phosphoric acid stored inside the processing tank 110 is discharged through the drainage piping. The discharged phosphoric acid is sent to a drainage processing apparatus (not illustrated) and is processed therein.

The substrate holding unit 120 holds the substrate W. The substrate W held by the substrate holding unit 120 is immersed in the phosphoric acid L stored in the processing tank 110.

The substrate holding unit 120 includes a main body plate 122 and holding rods 124. The main body plate 122 is a plate extending in the vertical direction (Z-direction). The holding rods 124 extend in the horizontal direction (Y-direction) from one main surface of the main body plate 122. Here, three holding rods 124 extend in the Y-direction from one main surface of the main body plate 122. A plurality of substrates W are held in an up-right posture (vertical posture) while the lower edges of the substrates W abut the plurality of holding rods 124 in a state where the plurality of substrates W are arranged in a direction toward the front and rear in the diagram.

The phosphoric acid supply unit 140 includes a nozzle 142, a piping 144, a valve 146, and a heater 148. The nozzle 142 ejects phosphoric acid to the processing tank 110. The nozzle 142 is connected to the piping 144. Phosphoric acid from a phosphoric acid the supply source is supplied to the piping 144. The valve 146 and the heater 148 are disposed in the piping 144. The heater 148 heats phosphoric acid flowing in the piping 144. The temperature of the phosphoric acid is adjusted by the heater 148. When the valve 146 is opened, phosphoric acid ejected from the nozzle 142 is supplied to the inside of the processing tank 110.

The temperature control unit 130 controls the heater 148. When the temperature control unit 130 controls the heater 148, the temperature of the phosphoric acid is controlled.

The water supply unit 150 includes a nozzle 152, a piping 154, and a valve 156. The nozzle 152 ejects water to the processing tank 110. The nozzle 152 is connected to the piping 154. As water to be supplied to the piping 154, any one of deionized water (DIW), carbonated water, electrolytic ion water, hydrogen water, ozonized water, and hydrochloric acid water at a dilute concentration (for example, within a range of approximately 10 ppm to 100 ppm) can be employed. Water from a water supply source is supplied to the piping 154. The valve 156 is disposed in the piping 154.

The substrate processing device 100 performs etching processing of a silicon oxide film (oxide film) and a silicon nitride film (nitride film) with respect to the front surface on a side where a pattern is formed in the substrate W constituted of a silicon substrate. In such etching processing, an oxide film and a nitride film are selectively removed from the front surface of the substrate W. For example, a nitride film is removed from the front surface of the substrate W using phosphoric acid.

In the substrate processing device 100 of the present embodiment, when the temperature control unit 130 controls the heater 148, the temperature of the phosphoric acid can be controlled. Accordingly, the substrate processing time can be shortened and disadvantages in substrate processing can be curbed.

Figure 9:
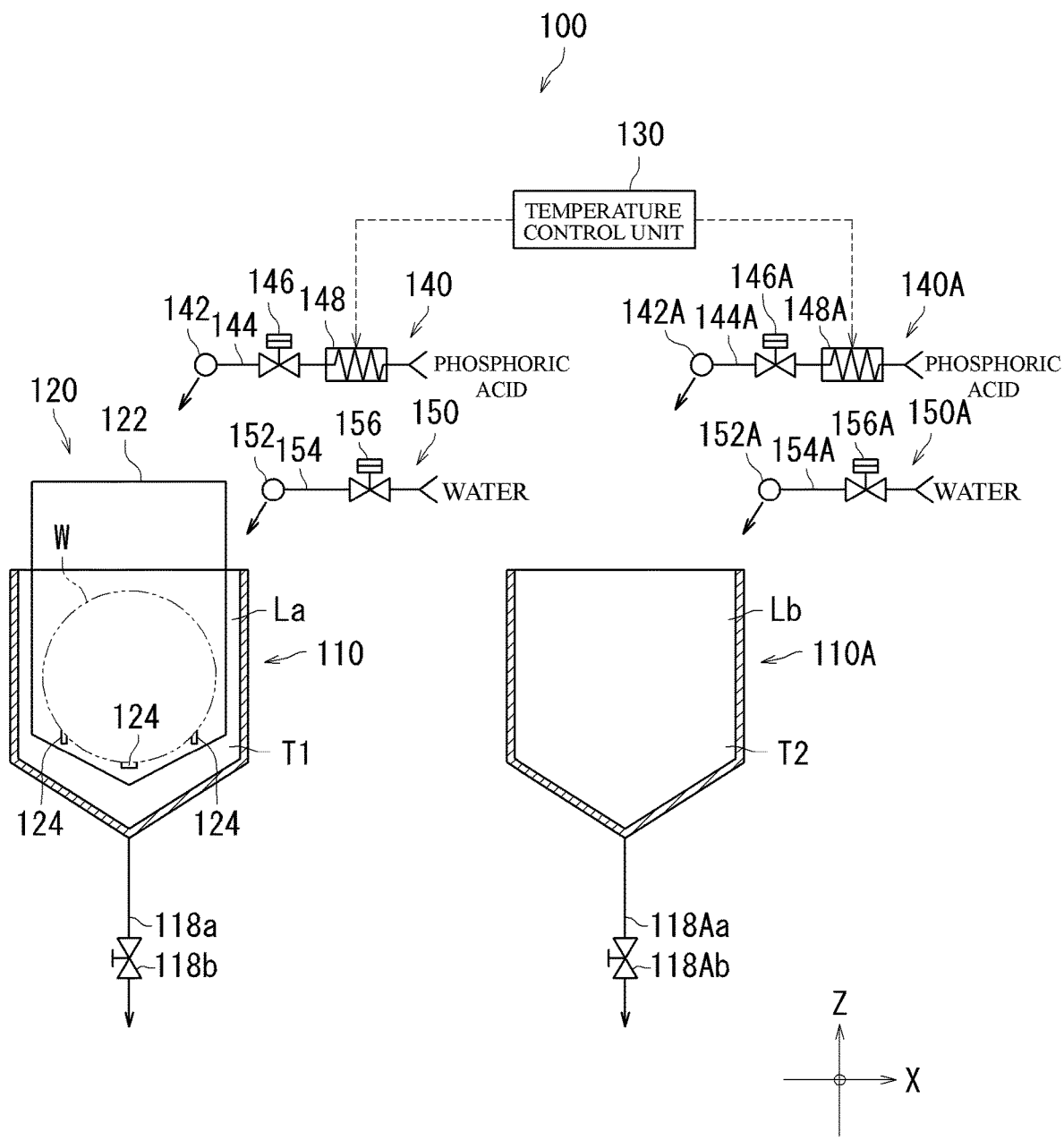
FIG. 9 is a schematic view of the substrate processing device of the present embodiment.

Next, with reference to FIG. 9, the substrate processing device 100 of the present embodiment will be described. FIG. 9 is a schematic view of the substrate processing device 100 of the present embodiment. In the substrate processing device 100 illustrated in FIG. 9, the substrate W is processed inside the processing tanks 110 and 110A at different temperatures.

The substrate processing device 100 includes the processing tank 110, the substrate holding unit 120, the temperature control unit 130, the phosphoric acid supply unit 140, and the water supply unit 150. In addition, the substrate processing device 100 further includes the processing tank 110A, a phosphoric acid supply unit 140A, and a water supply unit 150A. The processing tank 110A, the phosphoric acid supply unit 140A, and the water supply unit 150A have constitutions similar to the processing tank 110, the phosphoric acid supply unit 140, and the water supply unit 150. Duplicate description will be omitted to avoid redundancy.

The phosphoric acid La at the first temperature T1 is stored in the processing tank 110. The phosphoric acid Lb at the second temperature T2 is stored in the processing tank 110A.

The temperature control unit 130 controls the heater 148 and a heater 148A. When the temperature control unit 130 controls the heater 148, the temperature of the phosphoric acid La in the processing tank 110 is set to the first temperature T1. In addition, when the temperature control unit 130 controls the heater 148A, the temperature of the phosphoric acid Lb in the processing tank 110A is set to the second temperature T2.

The substrate holding unit 120 can move not only in the vertical direction (Z-direction) but also in the horizontal direction (X-direction). After the substrate W is immersed in the phosphoric acid L in the processing tank 110, the substrate holding unit 120 move upward while holding the substrate W and raises the substrate W from the phosphoric acid La in the processing tank 110. Thereafter, the substrate holding unit 120 moves to a place above the processing tank 110A. The substrate holding unit 120 moves downward while holding the substrate W such that the substrate W is immersed in the phosphoric acid Lb inside the processing tank 110A.

In the substrate processing device 100, processing of the substrate W proceeds when the substrate W is immersed in two processing tanks 110 and 110A set to different temperatures. Therefore, the substrate processing time can be shortened and disadvantages in substrate processing can be curbed.

In the substrate processing device 100 described with reference to FIGS. 8 and 9, phosphoric acid is supplied from above the processing tanks 110 and 110A. However, the present embodiment is not limited thereto. The phosphoric acid may be supplied from below the processing tanks 110 and 110A.

Figure 10:
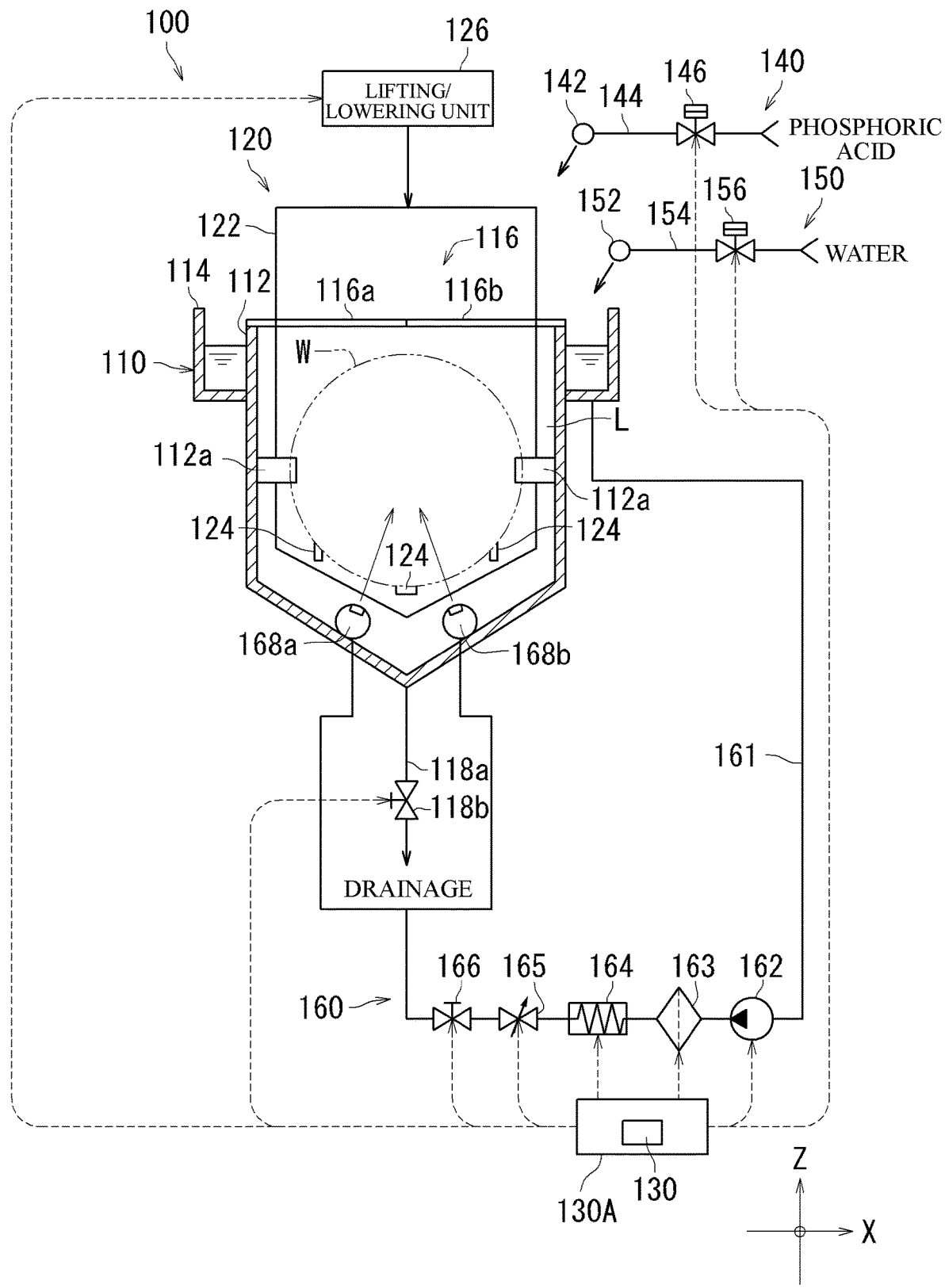
FIG. 10 is a schematic view of the substrate processing device of the present embodiment.

Next, with reference to FIG. 10, the substrate processing device 100 of the present embodiment will be described. FIG. 10 is a schematic view of the substrate processing device 100 of the present embodiment. The substrate processing device 100 illustrated in FIG. 10 further includes a circulation unit 160 and is similar to the substrate processing device 100 described above with reference to FIG. 8 except that an inner tank 112, an outer tank 114, and a lid 116 are provided in the processing tank 110, the substrate holding unit 120 has a lifting/lowering unit 126, and a heater 164 is provided in the circulation unit 160 in place of the heater 148 in the phosphoric acid supply unit 140. Therefore, duplicate description will be omitted to avoid redundancy.

The substrate processing device 100 includes a control unit 130A including the temperature control unit 130, and the circulation unit 160, in addition to the processing tank 110, the substrate holding unit 120, the temperature control unit 130, the phosphoric acid supply unit 140, and the water supply unit 150. In addition, the substrate holding unit 120 has the lifting/lowering unit 126.

The control unit 130A controls the circulation unit 160, in addition to the substrate holding unit 120, the phosphoric acid supply unit 140, and the water supply unit 150. The circulation unit 160 causes the phosphoric acid L stored in the processing tank 110 to circulate.

The processing tank 110 has a double tank structure including the inner tank 112 and the outer tank 114. The inner tank 112 and the outer tank 114 each have an upper opening which opens upward. The inner tank 112 is constituted such that the phosphoric acid L can be stored and a plurality of substrates W can be accommodated. The outer tank 114 is provided on the outer surface of the upper opening of the inner tank 112. The height of an upper edge of the outer tank 114 is larger than the height of the upper edge of the inner tank 112.

When the phosphoric acid L overflows from the upper edge of the inner tank 112, the overflowing phosphoric acid is received and collected by the outer tank 114. In addition, when the control unit 130A opens the valve 156, water ejected from the nozzle 152 is supplied to the inside of the outer tank 114.

The processing tank 110 has the lid 116. The lid 116 can block the upper opening of the inner tank 112. The lid 116 can open and close the upper opening of the inner tank 112.

The lid 116 has a door opening portion 116a and a door opening portion 116b. The door opening portion 116a is positioned on a side in the negative X-direction in the upper opening of the inner tank 112. The door opening portion 116a is disposed near the upper edge of the inner tank 112 and can open and close the upper opening of the inner tank 112. The door opening portion 116b is positioned on a side in the positive X-direction in the upper opening of the inner tank 112. The door opening portion 116b is disposed near the upper edge of the inner tank 112 and can open and close the upper opening of the inner tank 112. When the door opening portion 116a and the door opening portion 116b are closed and the upper opening of the inner tank 112 is covered, the inner tank 112 of the processing tank 110 can be blocked.

The substrate holding unit 120 further includes the lifting/lowering unit 126. The lifting/lowering unit 126 lifts and lowers the main body plate 122 between a processing position (position illustrated in FIG. 10) at which the substrates W held by the substrate holding unit 120 are positioned inside the processing tank 110 and a retreat position (not illustrated) at which the substrates W held by the substrate holding unit 120 are positioned above the processing tank 110. Therefore, when the main body plate 122 is moved to the processing position by the lifting/lowering unit 126, the plurality of substrates W held by the holding rods 124 are immersed in phosphoric acid. Accordingly, the substrates W are subjected to etching processing.

Liquid supply tubes 168a and 168b are provided in the processing tank 110. A plurality of ejection ports are provided in the liquid supply tubes 168a and 168b. The liquid supply tubes 168a and 168b supply phosphoric acid to the inner tank 112 of the processing tank 110. Typically, the liquid supply tubes 168a and 168b supply phosphoric acid, which has been supplied from the phosphoric acid supply unit 140 and then has been discharged from the processing tank 110, to the inner tank 112 of the processing tank 110.

The circulation unit 160 includes a piping 161, a pump 162, a filter 163, the heater 164, an adjustment valve 165, and a valve 166. The pump 162, the filter 163, the heater 164, the adjustment valve 165, and the valve 166 are disposed toward the downstream side from the upstream side of the piping 161 in this order. The piping 161 guides phosphoric acid, which has been discharged from the processing tank 110, to the processing tank 110 again.

The pump 162 sends phosphoric acid to the liquid supply tubes 168a and 168b through the piping 161. The filter 163 filters phosphoric acid flowing in the piping 161. The heater 164 heats phosphoric acid flowing in the piping 161. The temperature of the phosphoric acid is adjusted by the heater 164.

The adjustment valve 165 adjusts the flow rate of phosphoric acid supplied the liquid supply tubes 168a and 168b by regulating the opening degree of the piping 161. The adjustment valve 165 adjusts the flow rate of phosphoric acid. The adjustment valve 165 includes a valve body (not illustrated) in which a valve seat is provided, a valve element which opens and closes the valve seat, and an actuator (not illustrated) which moves the valve element between an opened position and a closed position. A similar constitution also applies to other adjustment valves. The valve 166 opens and closes the piping 161.

The adjustment valve 165 may be omitted. In this case, the flow rate of phosphoric acid supplied to the liquid supply tubes 168a and 168b can be adjusted by controlling the pump 162.

For example, the control unit 130A is constituted using a microcomputer. The control unit 130A has a computation unit such as a CPU, a storage unit such as a fixed memory device or a hard disk drive, and an input/output unit. A program executed by the computation unit is stored in the storage unit.

In addition, the control unit 130A controls operations of the lifting/lowering unit 126, the pump 162, the heater 164, and the like in accordance with a program set in advance. In addition, the control unit 130A controls opening/closing operations of the valve 118b, the valve 146, the valve 156, the valve 166, and the like. Moreover, the control unit 130A controls operations of adjusting the opening degree of the adjustment valve 165 and the like.

The ejection ports of the liquid supply tubes 168a and 168b are provided at positions inclined with respect to the vertical direction (Z-direction) such that their ejection directions are directed toward the center of the substrate W. Therefore, a liquid flow ejected obliquely upward through the ejection port of the liquid supply tube 168a and a liquid flow ejected obliquely upward through the ejection port of the liquid supply tube 168b join together, an extremely strong up-flow flowing upward inside the processing tank 110 can be formed.

The phosphoric acid which has been supplied upward from the liquid supply tubes 168a and 168b moves upward on the front surface of the substrate W while pushing out the part of the phosphoric acid in contact with the substrate W, and fresh phosphoric acid L present therearound enters after the phosphoric acid which has been supplied upward passes through. In this manner, when phosphoric acid which has been supplied upward comes into contact with the front surface of the substrate W, the front surface of the substrate W can be agitated. Accordingly, the phosphoric acid L on the front surface of the substrate W can be replaced with fresh phosphoric acid. As a result, the speed of processing the substrate W can be improved.

Next, with reference to FIGS. 10 and 11A to 11D, a change in a substrate processed by the substrate processing method of the substrate processing device 100 in FIG. 10 will be described. FIGS. 11A to 11D are schematic views illustrating a change in a substrate processed by the substrate processing method of the present embodiment. The substrate processing method illustrated in FIGS. 11A to 11D has a change similar to that described above with reference to FIGS. 4A to 4D except that a vertically upward flow of the phosphoric acid L is formed with respect to the substrate W inside the processing tank 110. Therefore, duplicate description will be omitted to avoid redundancy.

Figure 11A:
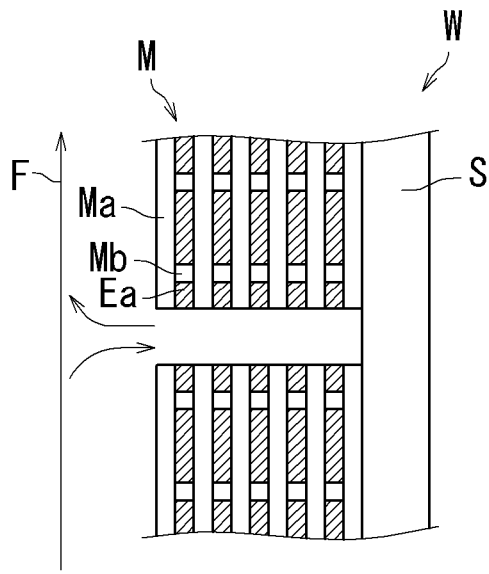
FIGS. 11A to 11D are schematic views illustrating a change in a substrate processed by the substrate processing method of the present embodiment.

As illustrated in FIG. 11A, the substrate W is disposed to expand in the XZ-plane. The substrate W has the base material S and the layered structure M. The substrate W is disposed such that the normal direction of the main surface is directed in the Y-direction. Here, phosphoric acid flows along a flow F of an up-flow directed vertically upward from vertically below, through the ejection ports of the liquid supply tubes 168a and 168b.

Figure 11C:
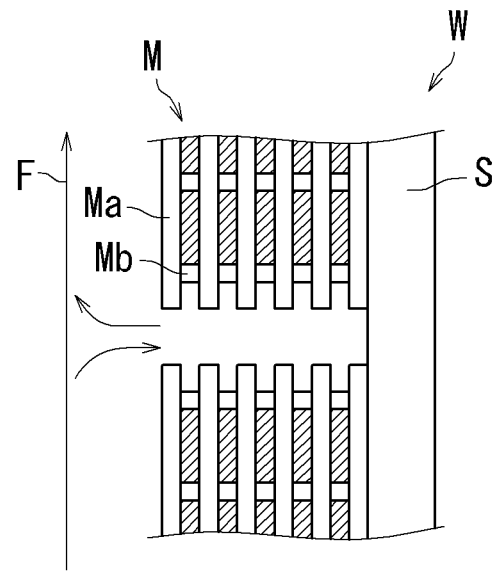
Figure 11B:
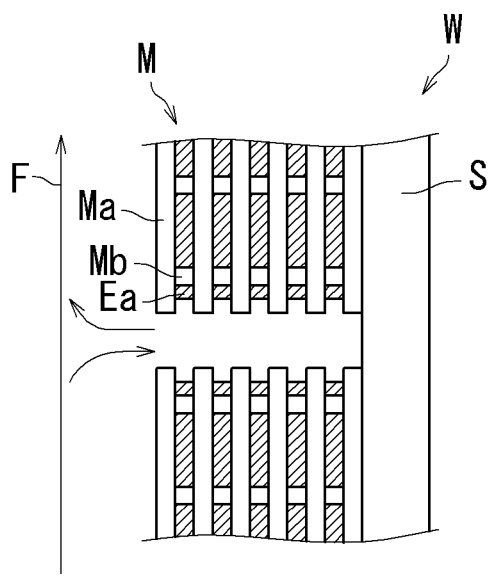

As illustrated in FIG. 11B, when phosphoric acid processing with respect to the substrate W starts to proceed, phosphoric acid infiltrates into the depressions of the substrate W. At this time, in the processing tank 110, since the flow F of an up-flow directed vertically upward from vertically below is formed, the phosphoric acid causes the etching layers Ea to melt in the depressions of the layered structure M. Thereafter, the phosphoric acid which has caused the etching layers Ea to melt promptly flows to the outside from the depressions of the substrate W.

As illustrated in FIG. 11C, when phosphoric acid processing with respect to the substrate W further proceeds, the etching layers Ea are etched due to the phosphoric acid which causes the etching layers Ea to gradually melt. After the phosphoric acid has caused the etching layers Ea to melt in the depressions of the layered structure M, the phosphoric acid which has caused the etching layers Ea to melt flows to the outside from the depressions of the substrate W.

Figure 11D:
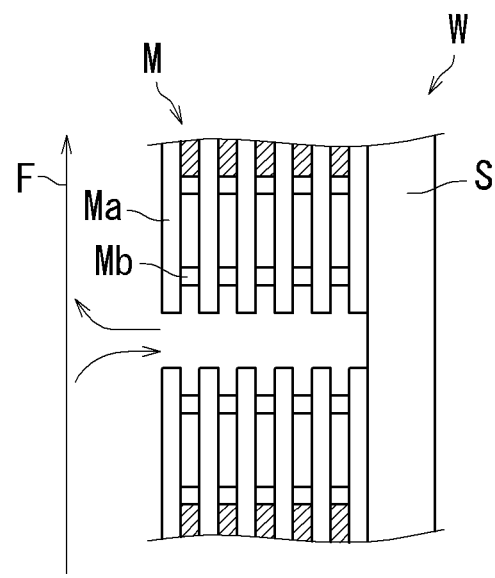

As illustrated in FIG. 11D, when the etching layers Ea of the substrate W melt and are removed due to the phosphoric acid, phosphoric acid processing with respect to the substrate W ends. A plurality of flat layers Ma and a plurality of pillars Mb are provided in the substrate W. In this manner, the substrate W having a layered structure can be manufactured through phosphoric acid processing.

As it is understood from the description referring to FIGS. 11A to 11D, the saturated concentration of the phosphoric acid is significantly affected not only by the layered structure M of the substrate W and the temperature of the phosphoric acid but also by the flow F of an up-flow. If the flow F of an up-flow becomes stronger, the concentration of the phosphoric acid is unlikely to exceed the saturated concentration. Therefore, the phosphoric acid can be set to a higher temperature.

In the substrate processing device 100 illustrated in FIG. 10, the phosphoric acid L stored in the processing tank 110 is caused to circulate and is supplied to the phosphoric acid L stored in the processing tank 110 from below the processing tank 110. However, the present embodiment is not limited thereto. A gas may be supplied from below the processing tank 110.

Figure 12:
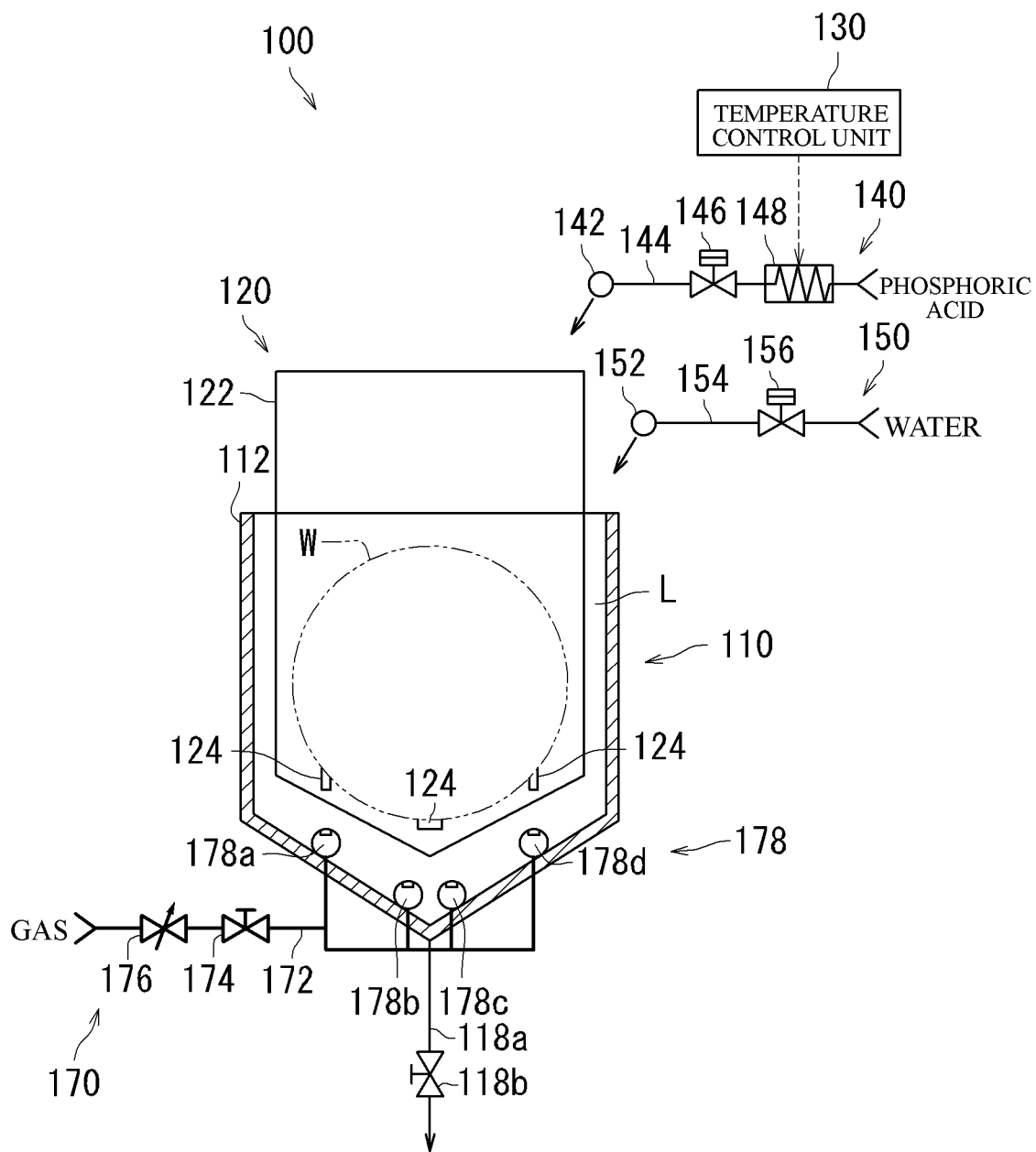
FIG. 12 is a schematic view of the substrate processing device of the present embodiment.

Next, with reference to FIG. 12, the substrate processing device 100 of the present embodiment will be described. FIG. 12 is a schematic view of the substrate processing device 100 of the present embodiment. The substrate processing device 100 illustrated in FIG. 12 is similar to the substrate processing device 100 described above with reference to FIG. 8 except that it further includes a gas supply unit 170. Therefore, duplicate description will be omitted to avoid redundancy.

The substrate processing device 100 includes the gas supply unit 170, in addition to the processing tank 110, the substrate holding unit 120, the temperature control unit 130, the phosphoric acid supply unit 140, and the water supply unit 150. The gas supply unit 170 supplies a gas to the processing tank 110.

The gas supply unit 170 includes a piping 172, a valve 174, an adjustment valve 176, and a gas supply tube 178. The valve 174 and the adjustment valve 176 are disposed in the piping 172. The piping 172 is coupled to the gas supply tube 178. The piping 172 guides a gas to the gas supply tube 178 inside the processing tank 110. The valve 174 opens and closes the piping 172. The adjustment valve 176 adjusts the flow rate of a gas conveyed to the gas supply tube 178, by regulating the opening degree of the piping 172.

The gas supply tube 178 includes the gas supply tubes 178a to 178d. A number of ejection ports are provided in the gas supply tube 178. A gas passing through the gas supply tube 178 is ejected to the phosphoric acid L in the processing tank 110 through the ejection port, and air bubbles are formed inside the phosphoric acid L. Air bubbles rise in the phosphoric acid L in the processing tank 110.

When air bubbles rise in the phosphoric acid L, the air bubbles come into contact with the front surface of the substrate W. In this case, air bubbles move upward on the front surface of the substrate W while pushing out the part of the phosphoric acid L in contact with the substrate W, and fresh phosphoric acid L present therearound enters after air bubbles pass through. In this manner, when air bubbles come into contact with the front surface of the substrate W, the front surface of the substrate W can be agitated. Accordingly, phosphoric acid on the front surface of the substrate W can be replaced with fresh phosphoric acid. As a result, the speed of processing the substrate W can be improved.

In the substrate processing device 100 illustrated in FIGS. 10 and 12, a liquid or a gas is supplied from the liquid supply tube or the gas supply tube disposed below the processing tank 110. However, the present embodiment is not limited thereto. A liquid and a gas may be each supplied from the liquid supply tube and the gas supply tube disposed below the processing tank 110.

Figure 13:
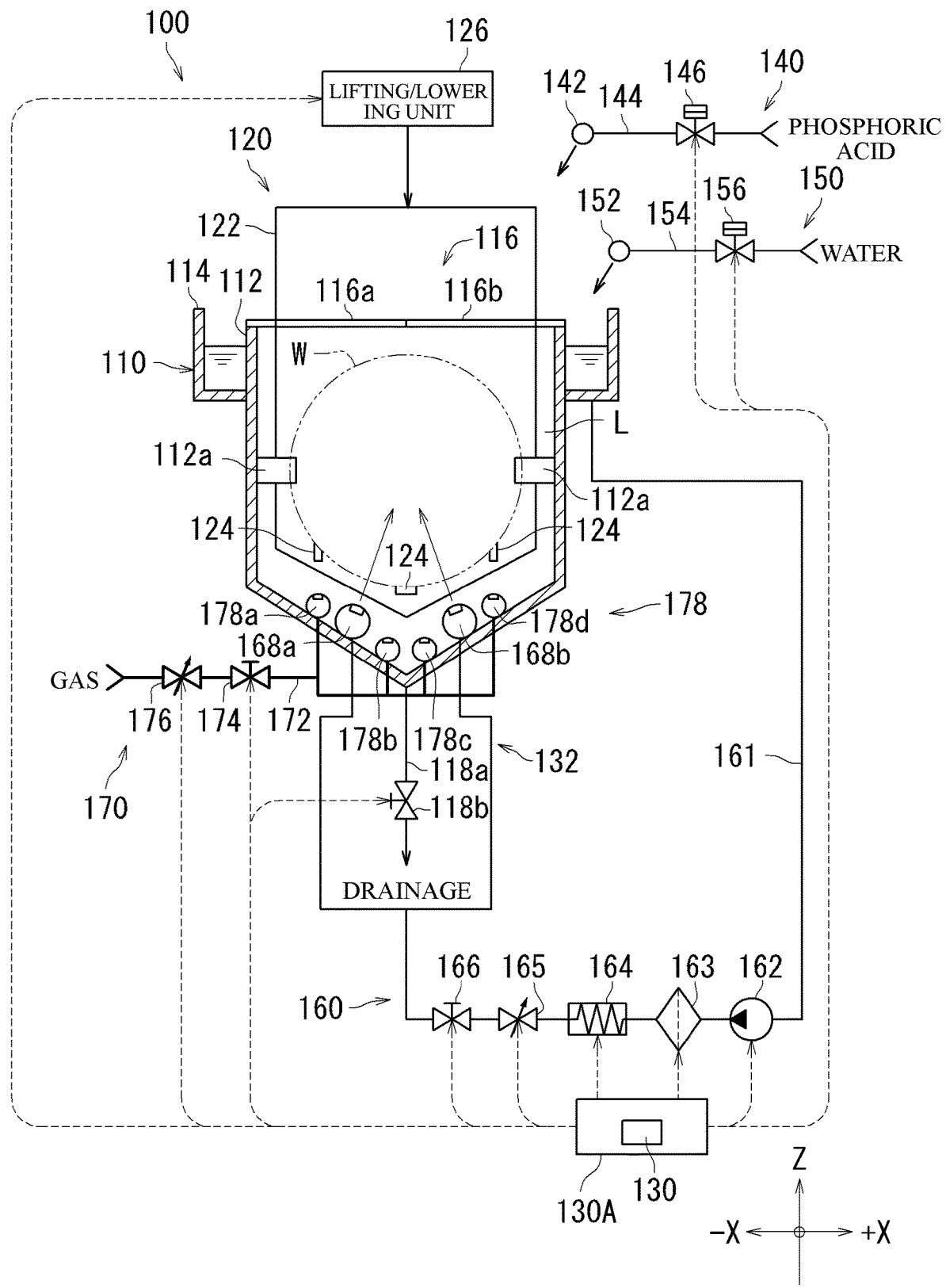
FIG. 13 is a schematic view of the substrate processing device of the present embodiment.

Next, with reference to FIG. 13, the substrate processing device 100 of the present embodiment will be described. FIG. 13 is a schematic view of the substrate processing device 100 of the present embodiment. The substrate processing device 100 illustrated in FIG. 13 is similar to the substrate processing device 100 described above with reference to FIG. 10 except that it further includes the gas supply unit 170. Therefore, duplicate description will be omitted to avoid redundancy.

The substrate processing device 100 includes the gas supply unit 170, in addition to the processing tank 110, the substrate holding unit 120, the control unit 130A including the temperature control unit 130, the phosphoric acid supply unit 140, the water supply unit 150, and the circulation unit 160. The gas supply unit 170 supplies a gas to the processing tank 110, and air bubbles are formed inside the phosphoric acid L. As described above, when air bubbles come into contact with the front surface of the substrate W, the front surface of the substrate W can be agitated. Accordingly, phosphoric acid on the front surface of the substrate W can be replaced with fresh phosphoric acid. As a result, the speed of processing the substrate W can be improved.

In addition, even when the liquid supply tubes 168a and 168b supply phosphoric acid to the processing tank 110, the phosphoric acid which has been supplied upward moves upward on the front surface of the substrate W while pushing out the part of the phosphoric acid in contact with the substrate W, and fresh phosphoric acid L present therearound enters after the phosphoric acid which has been supplied upward passes through. In this manner, when phosphoric acid which has been supplied upward comes into contact with the front surface of the substrate W, the front surface of the substrate W can be agitated. Accordingly, the phosphoric acid L on the front surface of the substrate W can be replaced with fresh phosphoric acid. As a result, the speed of processing the substrate W can be improved.

Figure 14:
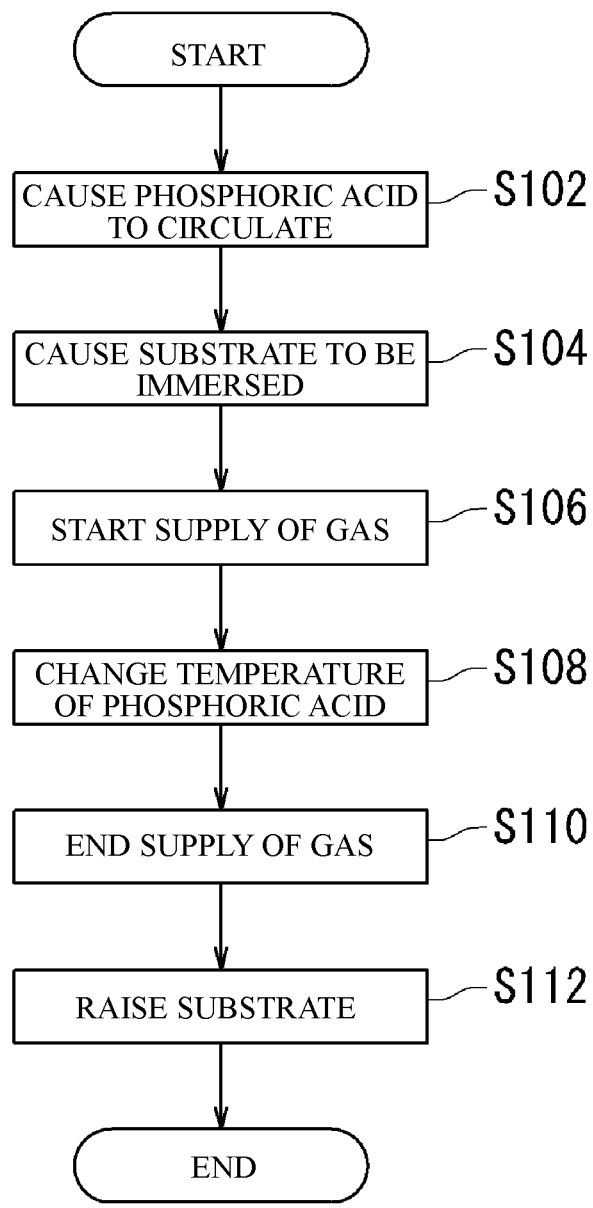
FIG. 14 is a flowchart for describing the substrate processing method of the present embodiment.

Next, with reference to FIG. 14, the substrate processing method performed by the substrate processing device 100 illustrated in FIG. 13 will be described. FIG. 14 is a flowchart for describing the substrate processing method of the present embodiment.

In S102, the circulation unit 160 starts circulation of phosphoric acid. When the control unit 130A opens the valve 166, the phosphoric acid which has passed through the piping 161 circulates toward the processing tank 110 via the liquid supply tubes 168a and 168b. The temperature control unit 130 controls the heater 164 to adjust the temperature of the phosphoric acid supplied to the inner tank 112 of the processing tank 110 from the liquid supply tubes 168a and 168b, to the first temperature.

In S104, the lifting/lowering unit 126 lowers the substrate W while holding the substrate W using the main body plate 122 and the holding rods 124 and causes the substrate W to be immersed in the inner tank 112 of the processing tank 110.

In S106, supply of a gas to the processing tank 110 is started. When the control unit 130A opens the valve 174, a gas is supplied to the inner tank 112 of the processing tank 110 from the gas supply tubes 178a to 178d.

In S108, the temperature of the phosphoric acid in the processing tank 110 is changed. The temperature control unit 130 controls the heater 164 to adjust the temperature of the phosphoric acid supplied to the inner tank 112 of the processing tank 110 from the liquid supply tubes 168a and 168b, to the second temperature.

In S110, supply of a gas to the processing tank 110 ends. The control unit 130A closes the valve 174 to end supply of a gas from the gas supply tubes 178a to 178d.

In S112, the lifting/lowering unit 126 lifts the substrate W while holding the substrate W using the main body plate 122 and the holding rods 124 and raises the substrate W from the inner tank 112 of the processing tank 110. In this manner, substrate processing ends.

In the substrate processing device 100 illustrated in FIGS. 1, 2A to 2D, 6A to 10, 12, and 13, the temperature control unit 130 controls the speed etching using phosphoric acid with respect to the substrate W by directly controlling the temperature of the phosphoric acid. However, the present embodiment is not limited thereto. The temperature control unit 130 may change not only the temperature of the phosphoric acid but also the temperature of the substrate W.

Figure 15:
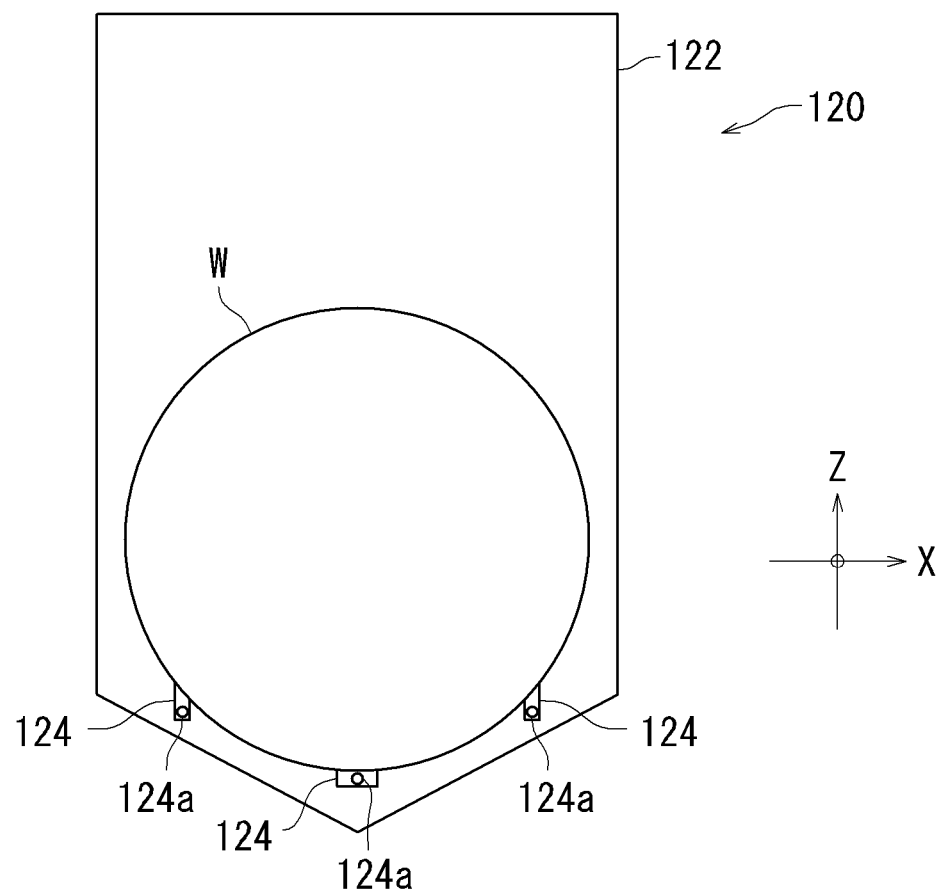
FIG. 15 is a schematic view illustrating a substrate holding unit in the substrate processing device of the present embodiment.

Next, with reference to FIG. 15, the substrate holding unit 120 in the substrate processing device 100 of the present embodiment will be described. FIG. 15 is a schematic view illustrating the substrate holding unit 120 in the substrate processing device 100 of the present embodiment.

The substrate holding unit 120 includes the main body plate 122 and the holding rods 124. The main body plate 122 extends in the vertical direction (Z-direction). The holding rods 124 extend in the horizontal direction (Y-direction) from one main surface of the main body plate 122. Here, three holding rods 124 extend in the Y-direction from one main surface of the main body plate 122.

In the substrate processing device 100 of the present embodiment, the holding rod 124 has a heater 124a. The heater 124a is positioned substantially at the center of the holding rod 124 and extends in the Y-direction together with the holding rod 124. When a current is supplied to the heaters 124a, the temperature of the substrate W placed on the holding rods 124 can be adjusted. For example, the substrate W can be intermittently heated by controlling the current in the heater 124a.

The substrate processing device 100 illustrated in FIGS. 1 to 15 is a batch-type processing device which performs processing of a plurality of substrates W at the same time. However, the present embodiment is not limited thereto. The substrate processing device 100 may be a single wafer-type processing device which performs processing of the substrate W one at a time.

Hereinabove, the embodiment of the disclosure has been described with reference to the drawings. However, the disclosure is not limited to the foregoing embodiment and can be realized in various forms within a range not departing from the gist thereof. In addition, various disclosures can be formed by suitably combining a plurality of constituent elements disclosed in the foregoing embodiment. For example, some constituent elements may be deleted from all of the constituent elements described in the embodiment. Moreover, constituent elements of different embodiments may be suitably combined. In order to facilitate the understanding, the drawings are schematically illustrated mainly regarding each of the constituent elements. There are cases where the thickness, the length, the number, the interval, and the like of each of the illustrated constituent elements are different from those of the actual constituent elements for the convenience of preparing the drawings. In addition, the material, the shape, the dimensions, and the like of each of the constituent elements illustrated in the foregoing embodiment are merely examples and are not particularly limited. Various changes can be made within a range not practically departing from the effects of the disclosure.

What is claimed is:

1. A substrate processing method for processing a substrate by phosphoric acid processing comprising:
    a first processing step of processing the substrate using phosphoric acid set to a first temperature in a processing tank at a start of the phosphoric acid processing;
    a second processing step of processing the substrate using phosphoric acid set to a second temperature in a processing tank after the first processing step, the second temperature being 3° C. to 20° C. higher than the first temperature; and
    a third processing step of processing the substrate using phosphoric acid set to a third temperature in a processing tank,
    wherein the third processing step is performed after the first processing step and the second processing step, and
    the third temperature is higher than the first temperature and the second temperature.

2. The substrate processing method according to claim 1, wherein a temperature of the phosphoric acid in the processing tank used in the first processing step is changed in the second processing step.

3. The substrate processing method according to claim 1, wherein the first processing step includes a step of immersing the substrate in a first processing tank storing the phosphoric acid set to the first temperature, and
    wherein the second processing step includes a step of immersing the substrate in a second processing tank storing the phosphoric acid set to the second temperature.

4. The substrate processing method according to claim 1, wherein the first processing step and the second processing step are alternately repeated.

5. The substrate processing method according to claim 1, further comprising:
   a heating step of heating a substrate support unit which supports the substrate.

6. The substrate processing method according to claim 5, wherein the substrate support unit is intermittently heated in the heating step.

7. A substrate processing method for processing a substrate by phosphoric acid processing comprising:
   a first processing step of processing the substrate using phosphoric acid set to a first temperature in a processing tank at a start of the phosphoric acid processing; and
   a second processing step of processing the substrate using phosphoric acid set to a second temperature in a processing tank after the first processing step, the second temperature being 3° C. to 20° C. higher than the first temperature,
   wherein
   the substrate has a layered structure which includes a plurality of flat layers, a plurality of etching layers, and a plurality of pillars embedded in the respective etching layers, the flat layers and the etching layers being alternately layered,
   in the first processing step, first portions of the etching layers in the layered structure are processed using the phosphoric acid set to the first temperature, the first portions ranging from outermost regions of the respective etching layers to regions of the respective etching layers where the pillars are located, and
   in the second processing step, second portions of the etching layers in the layered structure are processed using the phosphoric acid set to the second temperature, the second portions ranging from the regions of the respective etching layers where the pillars are located to regions of the respective etching layers beyond the pillars.

* * * * *